(12) United States Patent
Günlü et al.

(10) Patent No.: US 12,603,802 B2
(45) Date of Patent: Apr. 14, 2026

(54) METHOD AND SYSTEM FOR IDENTIFICATION VIA CHANNELS AND COMPUTER PROGRAM PRODUCT

(71) Applicants: TECHNISCHE UNIVERSITÄT BERLIN, Berlin (DE); TECHNISCHE UNIVERSITÄT MÜNCHEN, Munich (DE); NEW JERSEY INSTITUTE OF TECHNOLOGY, Newark, NJ (US)

(72) Inventors: Onur Günlü, Berlin (DE); Rafael F. Schaefer, Berlin (DE); Joerg Kliewer, Fair Lawn, NJ (US); Vladimir Sidorenko, Ulm (DE)

( * ) Notice: Subject to any disclaimer, the term of this patent is extended or adjusted under 35 U.S.C. 154(b) by 0 days.

(21) Appl. No.: 18/568,472

(22) PCT Filed: May 25, 2022

(86) PCT No.: PCT/EP2022/064260
§ 371 (c)(1),
(2) Date: Dec. 8, 2023

(87) PCT Pub. No.: WO2022/258386
PCT Pub. Date: Dec. 15, 2022

(65) Prior Publication Data
US 2024/0283684 A1 Aug. 22, 2024

(30) Foreign Application Priority Data
Jun. 9, 2021 (EP) ..................................... 21178612

(51) Int. Cl.
| *H03M 13/00* | (2006.01) |
| *H03M 13/15* | (2006.01) |
(Continued)

(52) U.S. Cl.
CPC .. *H04L 27/26035* (2021.01); *H03M 13/1515* (2013.01); *H04L 1/0064* (2013.01)

(58) Field of Classification Search
None
See application file for complete search history.

(56) References Cited

U.S. PATENT DOCUMENTS

| 8,170,059 | B2 * | 5/2012 | Collins | ................. | H04L 1/0075 |
| | | | | | 370/471 |
| 8,484,531 | B1 * | 7/2013 | Varnica | .............. | H03M 13/1111 |
| | | | | | 714/780 |

(Continued)

OTHER PUBLICATIONS

S. Verdu and V. K. Wei, "Explicit construction of optimal constant-weight codes for identification via channels", in IEEE Transactions on Information Theory, vol. 39, No. 1, pp. 30-36, Jan. 1, 1993, doi: 10.1109/18.179339.

(Continued)

*Primary Examiner* — Mujtaba M Chaudry

(57) ABSTRACT

The disclosure relates to a method for identification via channels in a system having a plurality of data processing devices. The method comprises selecting, in a first data processing device, an identifier indicative of a target second data processing device of a plurality of second data processing devices; determining, in the first data processing device, an outer codeword from the identifier using an outer code comprising a first outer code and a second outer code; determining, in the first data processing device, an optical orthogonal codeword from the outer codeword using an optical orthogonal code; determining, in the first data processing device; a randomly selected codeword from the optical orthogonal codeword using an error correction code; and emitting the selected codeword from the first data processing device via a channel. Further, a computer program product and a system for identification via channels are provided.

14 Claims, 2 Drawing Sheets

(51) Int. Cl.
  H04L 1/00          (2006.01)
  H04L 27/26         (2006.01)

(56)                References Cited

U.S. PATENT DOCUMENTS

| | | | | |
|---|---|---|---|---|
| 9,191,256 | B2 * | 11/2015 | Vojcic | H03M 13/3707 |
| 10,761,590 | B1 * | 9/2020 | Dixon | G06F 1/3275 |
| 10,778,385 | B2 * | 9/2020 | Taherzadeh Boroujeni | |
| | | | | H04L 5/0016 |
| 11,171,667 | B2 * | 11/2021 | Jang | H03M 13/114 |
| 2002/0145787 | A1 * | 10/2002 | Shpantzer | H04B 10/2572 |
| | | | | 398/99 |
| 2003/0106009 | A1 * | 6/2003 | Jarchi | H03M 13/29 |
| | | | | 714/755 |
| 2004/0161048 | A1 * | 8/2004 | Zaleski, II | H04L 1/0065 |
| | | | | 375/265 |
| 2006/0056757 | A1 * | 3/2006 | Ouchi | G02B 6/43 |
| | | | | 385/39 |
| 2008/0225818 | A1 * | 9/2008 | Niu | H03M 13/1515 |
| | | | | 375/240.01 |
| 2009/0010641 | A1 * | 1/2009 | Li | H04B 10/0775 |
| | | | | 398/9 |
| 2015/0039965 | A1 * | 2/2015 | Fonseka | H03M 13/271 |
| | | | | 714/756 |
| 2016/0234054 | A1 * | 8/2016 | Kanter | H04B 1/12 |
| 2016/0352419 | A1 * | 12/2016 | Fonseka | H04B 7/04 |
| 2018/0139727 | A1 * | 5/2018 | Bayesteh | H04B 7/0689 |
| 2018/0234115 | A1 * | 8/2018 | Noh | H04L 1/0064 |
| 2019/0044571 | A1 * | 2/2019 | Taherzadeh Boroujeni | |
| | | | | H04B 1/707 |
| 2021/0135733 | A1 * | 5/2021 | Huang | H04B 7/0691 |

OTHER PUBLICATIONS

Yimin Jiang and Feng-Wen Sun, "User identification for convolutionally/turbo-coded systems and its applications", in IEEE Transactions on Communications, vol. 51, No. 11, pp. 1796-1808, Nov. 1, 2003, doi: 10.1109/TCOMM.2003.818094.

Krishnan Eswaran, "Identification via Channels and Constant-Weight Codes", pp. 1-10, Jan. 1, 2005, Retrieved from the Internet: URL:https://peope.eecs.berkeley.edu/~ananth/229BSpr05/Reports/KrishEswaran.pdf, [retrieved on Oct. 25, 2021].

Jin-Ho Chung and K. Yang, "New constructions of asymptotically optimal optical orthogonal codes with = 1", 2012 IEEE International Symposium on Information Theory Proceedings, Cambridge, MA, USA, Jul. 1, 2012, pp. 1416-1420, doi: 10.1109/ISIT.2012.6283495.

Sara Bitan et al., "On constructions for optimal optical orthogonal codes", Jul. 19, 1993, Algebraic Coding, First French-Israeli Workshop, Springer, DE, pp. 111-125, XP047000937, ISBN: 978-3-540-57843-7.

International Search Report of the International Searching Authority, issued in PCT/EP2022/064260, mailed Aug. 26, 2022; ISA/EP.

* cited by examiner

METHOD AND SYSTEM FOR IDENTIFICATION VIA CHANNELS AND COMPUTER PROGRAM PRODUCT

CROSS-REFERENCE TO RELATED APPLICATIONS

This application is a 371 U.S. National Phase of International Application No. PCT/EP2022/064260, filed on May 25, 2022, which claims priority to European Patent Application No. 21178612.4, filed Jun. 9, 2021. The entire disclosures of the above applications are incorporated herein by reference.

The present disclosure refers to a method for identification via channels. Further, the present disclosure refers to a system for identification via channels and a computer program product.

BACKGROUND

In a classic wireless communication setup, a transmitting device transmits an encoded message over a noisy communication channel such that a receiving device that receives the encoded message (including additional noise) employs a decoder to determine which message was sent. In an identification via channels setup, the goal is different. Namely, the transmitting device selects an identifier (corresponding to a message in the classic communication setup), encodes the identifier, and sends the encoded identifier over a noisy (wireless) communication channel. Subsequently, the receiving device receiving a noisy version of the encoded identifier decides whether the transmitted identifier matches its assigned identifier.

SUMMARY

It is an object of the present disclosure to provide a method for identification via channels with improved reliability and allowing for an increased number of identifiers, in particular over a noisy communication channel.

For solving the problem, a method for identification via channels according to independent claim 1 is provided. Further, a computer program product is provided. Moreover, a system for identification via channels is provided. Further embodiments are disclosed in dependent claims.

According to one aspect, a method for identification via channels is provided. The method carried out in a system having a plurality of data processing devices comprises the following: selecting, in a first data processing device, an identifier indicative of a target second data processing device of a plurality of data processing devices; determining, in the first data processing device, an outer codeword from the identifier using an outer code comprising a first outer code and a second outer code; determining, in the first data processing device, an optical orthogonal codeword from the outer codeword using an optical orthogonal code; determining, in the first data processing device; a randomly selected codeword from the optical orthogonal codeword using an error correction code; and emitting (for example, broadcasting) the selected codeword from the first data processing device via a channel.

According to a further aspect, a system for identification via channels is provided, the system comprising a plurality of data processing devices and configured to: select, in a first data processing device, an identifier indicative of a target second data processing device of a plurality of data processing devices; determine, in the first data processing device, an outer codeword from the identifier using an outer code comprising a first outer code and a second outer code; determine, in the first data processing device, an optical orthogonal codeword from the outer codeword using an optical orthogonal code; determine, in the first data processing device, a randomly selected codeword from the optical orthogonal codeword using an error correction code; and emit the selected codeword from the first data processing device via a channel.

According to another aspect, a computer program product is provided. The computer program product comprises instructions which, when the computer program product is executed by a first data processing device, cause the first data processing device to perform the method for identification via channels.

With the proposed method, a number of identifiers (corresponding to a number of second data processing devices) transmitted from the first data processing device that can be reliably identified at a second data processing device for a fixed maximum probability of identification error can be substantially increased. Further, identification via noisy channels comprises scaling properties different from classic communication setups and can be applied to networks with large numbers of second data processing devices such as, for instance, Internet-of-Things (IoT) networks comprising large numbers of sensors.

The identifiers can be assigned to, e.g., devices, digital watermarks, and/or molecules in molecular communication. Therefore, device identification, watermark identification, and/or molecule identification can be addressed by applying the proposed method for identification via channels. The method can be applied for digital watermarking of digital data structures with large numbers of different image files, video files, or audio files, as well as for molecular communication.

Already established (wireless) communication setups (with classic transmitters and receivers) can readily be adapted for the proposed method to enable identification via (wireless) communication channels. Therefore, the proposed method and system can be integrated into classic (wireless) communication systems, but can also be used in other setups, such as for watermarking and molecular communication.

Mathematically, an optical orthogonal code may be described as a code with parameters $(S, N, W, \lambda_a, \lambda_c)$ comprising N codewords $\{x_1, x_2, \ldots, x_N\}$ of block length S and (Hamming) weight W with symbols from the set $\{0, 1\}$ such that for all $\tau_a \in \{1, \ldots, (S-1)\}$, $\tau_c \in \{0, \ldots, (S-1)\}$, $j,j' \in \{1, \ldots, N\}$, and $j \neq j'$ the following holds:

$$\sum\nolimits_{s=1}^{S} x_{j,s} x_{j,(s+\tau_a)} \leq \lambda_a$$

and $$\sum\nolimits_{s=1}^{S} x_{j,s} x_{j',(s+\tau_a)} \leq \lambda_c,$$

wherein $(s+\tau_a)$ and $(s+\tau c)$ are additions modulo.

The optical orthogonal code may be a constant weight code with codewords comprising binary symbols such that the number of overlaps of first symbols (e.g. symbols "1") is upper bounded for each codeword pair and their cyclic shifts.

The identifier may be an integer value. Preferably the identifier may be an integer value out of a set of integers with a number of elements equal to the number of second data processing devices of the system. Each of the plurality of identifiers may be unique for the corresponding one of the plurality of second data processing devices.

The system may comprise the plurality of second data processing devices and a plurality of identifiers each indicative of one of the plurality of second data processing devices. The first data processing device may comprise a first processing unit and/or a first transceiver unit. The first transceiver unit may be configured to send and/or receive signals via the channel (communication channel). Each of the plurality of second data processing devices may comprise a second processing unit and a second transceiver unit configured to send and receive signals via the communication channel. In particular, signals may be exchanged between the first data processing device and each of the plurality of second data processing devices. The communication channel may be shared between the first data processing device and the plurality of second data processing devices. The communication channel may be wireless and/or comprise a networking cable.

The number of second data processing devices may for example be greater than 2, between 5 and 50, 10 and 100, 50 and 500, 100 and 10000, 1000 and 100000, or 10000 and 1000000.

The identifier may be determined/generated in the second data processing device, preferably using a first physical unclonable function (PUF), and be transmitted from the second data processing device to the first data processing device (prior to selecting the identifier in the first data processing device). Alternatively, the identifier may be determined in the first data processing device and be transmitted from the first data processing device to the second data processing device.

The second outer code may be concatenated with the first outer code.

The outer code may consist of the first outer code and the second outer code.

Within the context of the present disclosure, concatenating a code with a further code corresponds to applying the code to an input quantity and subsequently applying the further code to the resulting quantity (serial concatenation).

An intermediate codeword may be determined from the identifier using the second outer code. The outer codeword may be determined from the intermediate codeword using the first outer code.

The outer code may be concatenated with the optical orthogonal code, in particular such that that the optical orthogonal code is used as an inner code. Preferably, the second outer code may be concatenated with the first outer code which may be concatenated with the optical orthogonal code.

The outer code may comprise at least one of a Reed-Solomon-code, an extended Reed-Solomon-code, and a doubly-extended Reed-Solomon-code. In general, the outer code may comprise a maximum distance separable (MDS) code.

It may also be provided that the outer code is a maximum distance separable code, in particular, one of a Reed-Solomon-code, an extended Reed-Solomon-code, and a doubly-extended Reed-Solomon-code. Alternatively, the first outer code may be a maximum distance separable code, in particular one of a Reed-Solomon-code, an extended Reed-Solomon-code, and a doubly-extended Reed-Solomon-code. Further, the second outer code may be a maximum distance separable code, in particular one of a Reed-Solomon-code, an extended Reed-Solomon-code, and a doubly-extended Reed-Solomon-code.

The outer code and/or the first outer code, and/or the second outer code may be a channel code with high ratio of a code-minimum-distance and a block length. In particular, the code-minimum distance may be upper bounded the Singleton bound for block codes, i.e., by the value of the block length minus the code-dimension plus one.

The outer code and/or the first outer code and/or the second outer code may also be a code different from Reed-Solomon-code, extended Reed-Solomon-code, and doubly-extended Reed-Solomon-code.

At least one of the outer code, the optical orthogonal code, and the outer code concatenated with the optical orthogonal code may be a binary constant weight code. The binary constant weight code may comprise only codewords having a same (constant) Hamming weight. The (Hamming) weight of a codeword is equal to the number of non-zero symbols of the codeword.

Further, at least one of the first outer code, the second outer code, and the second outer code concatenated with the first outer code concatenated with the optical orthogonal code may be a binary constant weight code.

A number of codewords of the optical orthogonal code may be a prime power (i.e., a power of a prime number.

The optical orthogonal code may comprise a prime sequence, particularly a plurality of prime sequences. Each prime sequence may be generated by multiplying in modulo-p all field elements of a Galois Field GF(p) with one of the field elements, wherein each field element may be mapped to an integer in the range $[0, 1, \ldots, p-1]$, wherein p is a prime number.

In particular, the prime sequences may be $\{(00000), (01234), (02413), (03142), (04321)\}$ (for p=5).

Each of the plurality of prime sequences may be mapped to a binary sequence. Preferably, each of the plurality of prime sequences may be one-hot encoded. In particular, each symbol may be mapped to an index in a binary sequence of length p such that at a corresponding index there is the first symbol and other indices contain a second symbol.

The first symbol and/or the second symbol may be a binary symbol. The first symbol and/or the second symbol may each correspond to one element of the set $\{0, 1\}$. The first and the second symbol may be different from each other. The first symbol may correspond to an integer value of 1. The second symbol may correspond to an integer value of 0.

For instance, prime sequence (01234) may be mapped to binary sequence (10000 01000 00100 00010 00001).

The optical orthogonal code (in particular, generated from a prime sequence) may be modified by removing each first codeword entry (position of the first codeword) containing the second symbol.

Further, other modifications that can reduce a number of overlaps of the first symbol between codeword pairs of the optical orthogonal code may be applied to the optical orthogonal code. Thus, identification via channels performance can be improved. Removing each first codeword entry/position containing the second symbol may be carried out before one-hot encoding.

The method may comprise (randomly) selecting the selected codeword from a set of error correction codewords of the error correction codes. The method may additionally comprise determining the set of error correction codewords of the error correction code. In particular, the method may comprise: determining, in the first data processing device, one error correction codeword of a set of error correction codewords of the error correction code for each entry of the optical orthogonal codeword containing the first symbol and selecting the selected codeword from the set of error correction codewords.

The set of error correction codewords may be determined depending on the communication channel, in particular such that a low block-error probability after decoding by the second data processing system is provided.

The error correction code may be one of a polar code (preferably with a successive cancellation list (SCL) decoder) and an outer cyclic redundancy check (CRC) code. Similarly, low-density parity check (LDPC) codes are also such an example, which are also used in the 3GPP standard for 5G. We can name them explicitly.

The selected codeword may be randomly selected in the first data processing device using a (second) physical unclonable function. A second physical unclonable function output may be distributed with a uniform or a non-uniform probability distribution.

The selected codeword may be embedded into a digital data file, for example into an image file, a video file, or an audio file, which may preferably be used as a watermark.

Emitting the selected codeword from the first data processing device may comprise transmitting the selected codeword from the first data processing device to a second data processing device of the plurality of second data processing devices. Transmitting the selected codeword from the first data processing device to the second data processing device may result in a noisy selected codeword in the second data processing device.

In particular, the selected codeword may be transmitted from the first data processing device to each of the plurality of second data processing devices.

The method may further comprise at least one of: receiving a noisy selected codeword in at least one of (the plurality of the second data processing devices; determining, in the at least one of the plurality of second data processing device, the selected codeword from the noisy selected codeword using a decoding method; and determining, in the at least one of the plurality of second data processing devices, whether the selected codeword is indicative of the at least one of the plurality of second data processing devices. In particular, the selected codeword being indicative of the second data processing device may correspond to the second data processing device being the target second data processing device.

The method may further comprise: In case the selected codeword is indicative of the second data processing device, transmitting a message from the second data processing device to the first data processing device.

In case the selected codeword is indicative of the second data processing device, further messages may be exchanged between the first and the second data processing device.

In case the selected codeword is not indicative of the second data processing device, further messages from the first data processing device may be ignored by the second data processing device, preferably for a certain time interval.

The decoding method may comprise at least one of a successive cancellation list decoder for polar codes and a density evolution decoder for LDPC codes.

The method may comprise in particular: receiving a noisy selected codeword in each of the second data processing devices; determining, in each of the second data processing devices, the selected codeword from the noisy selected codeword using a decoding method; and determining, in each of the second data processing devices, whether the selected codeword is indicative of the respective second data processing device.

The selected codeword may be determined as indicative of the target second data processing device if the selected codeword is contained in the set of error correction codewords assigned to the identifier indicative of the target second data processing device.

Preferably, out of n codewords of the error correction code, W may be assigned to each identifier. Further, assignments of the subsets of the error correction codewords may be provided in an overlapping manner. For example, if the error correction code has error correction codewords {a,b, c,d,e}, a first subset {a,b,c} may be assigned to a first identifier, a second subset {b,c,d} may be assigned to a second identifier, and a third subset {a,d,e} may be assigned to a third identifier by using the binary constant weight code. If in particular the second identifier shall be transmitted, one of the three codewords of the second subset {b,c,d} may be selected and subsequently by transmitted.

The identifier may be modified using a randomly generated offset number before determining the outer codeword from the identifier. Thus, secure identification via channels can be provided.

In particular, the identifier may be modified by adding the identifier to the offset number and taking the result modulo the number of second data processing devices. The offset number may be generated in the first data processing device, preferably using a uniform probability distribution and/or using a (first) PUF. The offset number may be shared with the second data processing devices before selecting the identifier in the first data processing device.

The aforementioned embodiments related to the method for device identification can be provided correspondingly for the system and the computer program product.

DESCRIPTION OF FURTHER EMBODIMENTS

In the following, embodiments, by way of example, are described with reference to figures.

Figure 1:
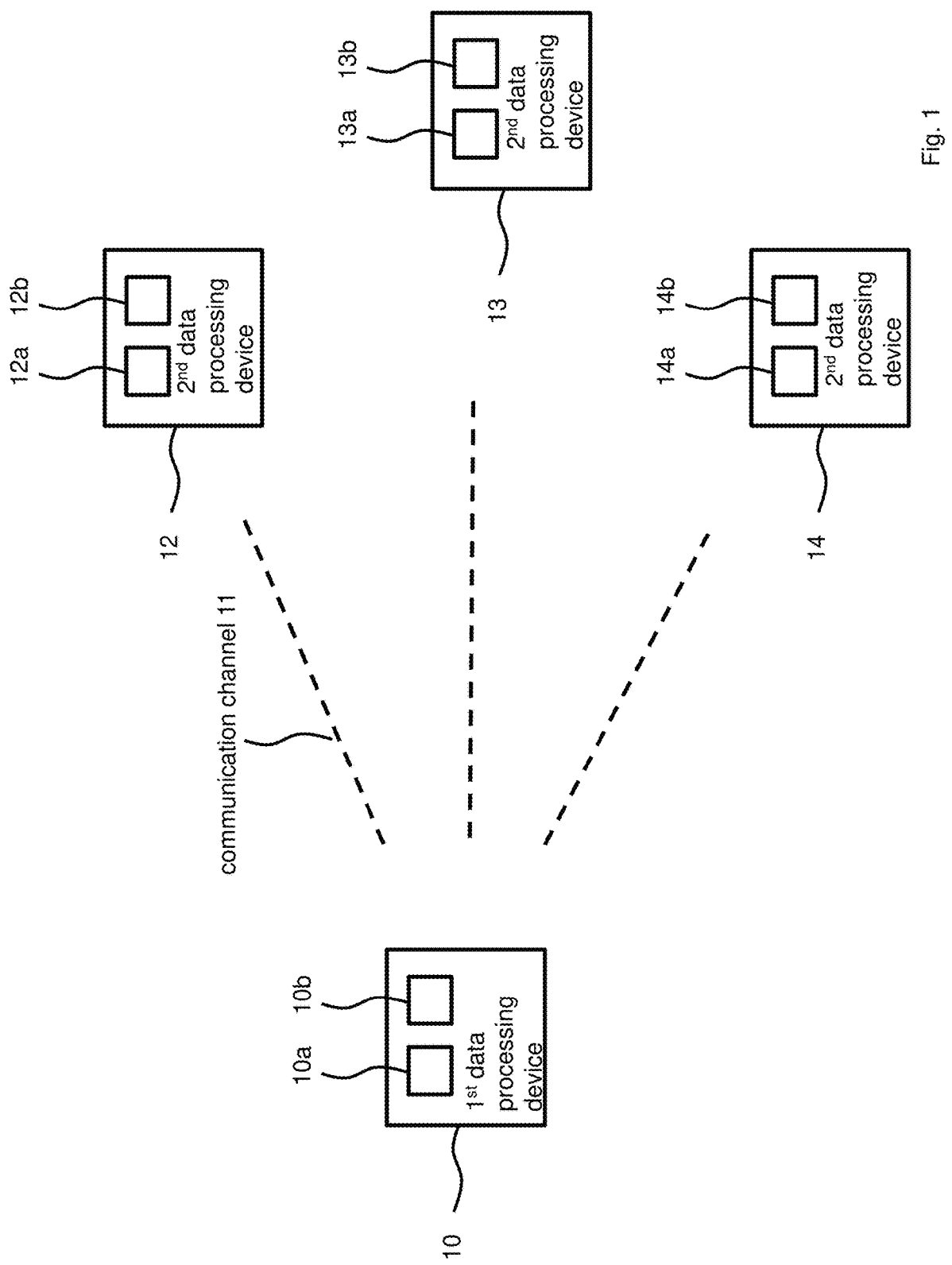
FIG. 1 shows a graphical representation of a system for identification via channels.

In FIG. 1, a graphical representation of a system for identification via channels is shown. The system comprises a first data processing device 10 with a first processing unit 10a and a first transceiver unit 10b. The transceiver unit 10b is configured to send and receive signals via a communication channel 11.

The system may further comprise a plurality of second data processing devices 12, 13, 14 (in total, N second data processing devices 12, N being an integer; in FIG. 1, only three second data processing device 12, 13, 14 are shown). Each of the second data processing devices 12, 13, 14 comprises a second processing unit 12a, 13a, 14a and a second transceiver unit 12b, 13b, 14b configured to send and receive signals via the communication channel 11. In particular, signals may be exchanged between the first data processing device 10 and each of the plurality of second data processing devices 12, 13, 14. The communication channel 11 may be shared between the first data processing device 10 and the plurality of second data processing devices 12, 13, 14. The communication channel 11 is preferably wireless.

Each of the second data processing devices 12 is assigned a unique identifier j out of a set of N identifiers {1, 2, . . . , N}. Each identifier j can be an output of a first physical unclonable function (PUF) of the corresponding second data processing device 12. The assignment of each identifier j is communicated from the corresponding one of the second data processing devices 12 to the first data processing device 10. Further, all encoding and decoding rules are fixed for the first data processing device 10 and the plurality of second data processing devices 12. The rules can be made public.

Figure 2:
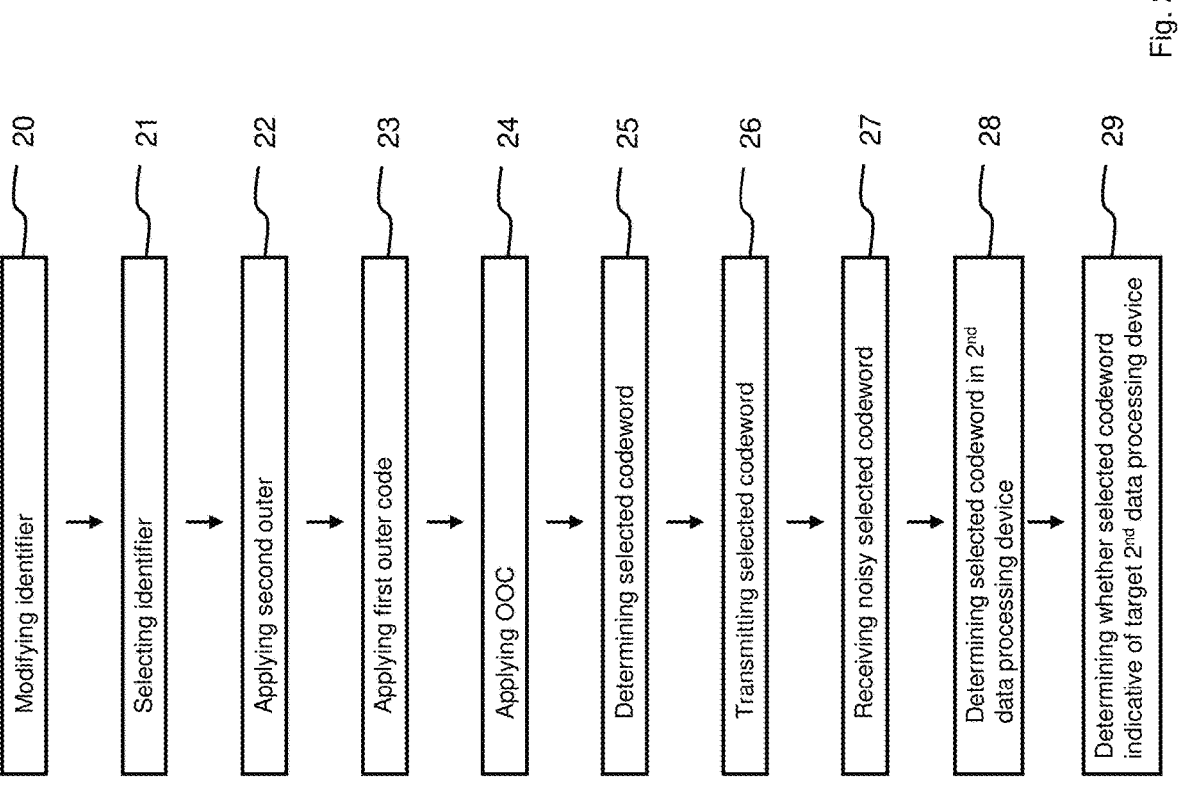
FIG. 2 shows a graphical representation of the proposed method for identification via channels.

FIG. 2 shows a graphical representation of the proposed method for identification via channels.

Security of the method against a potential attacker having access to transmitted codewords can be established by modifying the identifier j using a randomly generated offset number l before determining the outer codeword (zeroth step 20). Thus, the attacker is prevented from directly determining the corresponding identifier j.

For example, the identifier j is added to the randomly generated number l (which is a number in $\{1, 2, \ldots, N\}$) and the result is taken modulo N, i.e., $j \mapsto (j+l) \bmod (N)$. The offset number l may be uniformly-randomly generated (using a (first) PUF). The offset number l should be shared before transmission with each of the second data processing devices 12, 13, 14 such that each of the second data processing devices 12, 13, 14 can readily apply corresponding demapping operations for the modified identifier.

In a first step 21, the identifier j indicative of a target second data processing device 12 (the device to be identified) of the plurality of second data processing devices 12, 13, 14 is selected among N identifiers in the first data processing device 10.

Subsequently, in a second step 22, a third step 23, and a fourth step 24, a binary constant weight code (CWC) with weight W is applied to the identifier j. Each binary CWC is a deterministic one-to-one mapping between an identifier in the set $\{1, 2, \ldots, N\}$ to a sequence of length n that consists of n symbols of zeros and ones, wherein the number of symbol "1" is fixed (constant) and equal to the weight W. The weight W is less than or equal to n. Each binary CWC can be represented by a matrix with number of columns n and number of rows N. The matrix has matrix entries with either 0 or 1 and has the same number of 1-entries in each row (which is equal to the weight W).

The binary CWC comprises a second outer code, a first outer code, and an optical orthogonal code (OOC) which are subsequently concatenated.

In the second step 22, the second outer code is applied to the identifier j, yielding an intermediate codeword. The second outer code may be a channel code with a high ratio of code-minimum-distance to block length, such as Reed-Solomon (RS) code, extended RS code, or doubly-extended RS code.

In the third step 23, the first outer code is applied to the intermediate codeword, yielding an outer codeword. The first outer code may also be any channel code with high ratio of code-minimum-distance to block length, such as RS code, extended RS code, or doubly-extended RS code.

In the fourth step 24, an OOC is applied to the outer codeword, resulting in an optical orthogonal codeword. The OOC together with the first and the second outer code corresponds to a specific binary CWC for identification via noisy channels. The OOC may be modified by reducing a number of overlaps of symbol "1" between codeword pairs of the OOC.

In contrast, other known methods make use of, e.g., pulse position modulation (PPM).

Code parameters of the OOC, the first outer code, and the second outer code can be matched. For instance, if doubly-extended RS codes are used both for the first and the second outer code, due to constraints to create a doubly-extended RS code, a size N of the OOC should be a prime power, a first block length of the first outer code should be (N+1) for a doubly-extended RS code and a first code dimension $k_0$ of the first outer code should satisfy $k_0 < (N-1)$. Further, a second block length of the second outer code should be $(N^{k_0}+1)$ for a doubly-extended RS and a second code dimension $k_{00}$ should satisfy $k_{00} < (N^{k0}-1)$. Similar rules should be imposed also for extended RS codes and RS codes as well as for other appropriate outer codes.

In a fifth step 25, a selected codeword is determined in the first data processing device 10 from the optical orthogonal codeword corresponding to the identifier j using an error correction code. To this end, for each entry of the optical orthogonal codeword containing the symbol "1", one error correction codeword of a set of error correction codewords of the error correction code is mapped. From the set of error correction codewords that are assigned to the identifier j, the selected codeword is randomly selected, for example using a second PUF with a uniform or a non-uniform probability distribution.

Specifically, the optical orthogonal codeword corresponding to the identifier j has a fixed number of first symbols "1" for each index, while the remaining second symbols correspond to "0". There are W indices out of all n indices that have the first symbol "1". Each of the n indices can be one-to-one mapped to one of n error correction codewords of an error correction code. The error correction code can in principle be any channel code that can provide classic reliable (wireless) communication with n different codewords such as polar code, low-density parity check (LDPC) code, or RS code. In particular, polar codes with successive cancellation list (SCL) decoder and outer cyclic redundancy check (CRC) codes, as in the 3GPP standard for control channels of 5G networks, may represent suitable error correction codes.

For the optical orthogonal codeword corresponding to the identifier j with weight W, an amount of W error correction codewords among all n error correction codewords of the error correction code will be assigned. Among these W error correction codewords (forming the set of error correction codewords for identifier j), one of them, the selected codeword, is determined uniformly-randomly via the second PUF.

In a sixth step 26, the selected codeword is transmitted from the first data processing device 10 to each of the plurality of second data processing devices 12, 13, 14 via the communication channel 11.

For wireless device identification problems in Internet-of-Things networks, the selected codeword is sent as such over the communication channel 11. However, for digital watermarking applications, the selected codeword may be embedded into a digital data file (such as an image file, video file, or audio file) that should be watermarked for later identification.

In a seventh step 27, a noisy selected codeword comprising the selected codeword and additional noise from transmission is received in each second data processing device 12, 13, 14.

In an eighth step 28, the selected codeword is determined in each second data processing device 12, 13, 14 using a decoding method. The decoding method may comprise channel decoders such as successive cancellation list decoders for polar codes or density evolution decoders for LDPC codes.

In a ninth step 29, it is determined in each second data processing device 12, 13, 14 whether the selected codeword (corresponding to the identifier j) is indicative of the target second data processing device 12. This will only be the case for the second data processing device 12, 13, 14 with assigned identifier j. I.e., considering one of the second data processing devices 12, 13, 14 with second identifier k, wherein the transmitted identifier j is not necessarily the same as the second identifier k, there are W possible error correction codewords assigned to the second identifier k. If k is not equal to j, the set of error correction codewords each with size W assigned to the second identifier k and assigned to the identifier j will consist of different error correction codewords (although some of the error correction codewords may be common). The second data processing device 12, 13, 14 with second identifier k determines whether the selected codeword is in the set of possible error correction codewords with size W that had been determined for the second identifier k. If this is the case, this means that the transmitted identifier j was also the same as the second identifier k, i.e., j=k. Hence the second data processing device corresponds to the target second data processing device 12. Otherwise, it is determined that the transmitted identifier j of the target second data processing device 12 does not correspond to the second identifier k of the second data processing device 12, 13, 14.

In case the offset number l had been used to modify the identifier j, the routine in the second data processing device 12, 13, 14 has to be adapted correspondingly.

Optionally, in case the selected codeword has been determined as indicative of the target second data processing device 12, i.e., the second data processing device 12, 13, 14 is the target second data processing device 12, a message may be transmitted from the (target) second data processing device 12 back to the first data processing device 10 and further communication may take place, including exchanging further messages. In case of watermarking, the watermark of interest is deemed as identified and the watermarked digital data file will be saved and/or further processed.

Otherwise, the second data processing device 12, 13, 14 will ignore further communication from the first data processing device 10 associated with the identifier j (in case of watermarking, the watermarked digital data file will not be saved and/or further processed).

The features disclosed in this specification, the figures and/or the claims may be material for the realization of various embodiments, taken in isolation or in various combinations thereof.

The invention claimed is:

1. Method for identification via channels in a system having a plurality of data processing devices, comprising:
   selecting, in a first data processing device, an identifier indicative of a target second data processing device of a plurality of second data processing devices;
   determining, in the first data processing device, an outer codeword from the identifier using an outer code comprising a first outer code and a second outer code;
   determining, in the first data processing device, an optical orthogonal codeword from the outer codeword using an optical orthogonal code;
      identifying entries of the optical orthogonal codeword having a first symbol;
      for each identified entry of the optical orthogonal codeword, mapping the identified entry to a codeword of an error correction code, thereby forming a set of error correction codewords;
   randomly selecting a codeword from the set of error correction codewords; and emitting the selected codeword from the first data processing device via a channel.

2. Method according to claim 1, wherein the identifier is an integer value.

3. Method according to claim 1, wherein the second outer code is concatenated with the first outer code.

4. Method according to claim 1, wherein the outer code comprises at least one of a Reed-Solomon-code, an extended Reed-Solomon-code, and a doubly-extended Reed-Solomon-code.

5. Method according to claim 1, wherein at least one of the outer code, the optical orthogonal code, and the outer code concatenated with the optical orthogonal code is a binary constant weight code.

6. Method according to claim 1, wherein a number of codewords of the optical orthogonal code is a prime power.

7. Method according to claim 1, wherein the optical orthogonal code is modified by removing each first codeword entry containing a second symbol.

8. Method according to claim 1, wherein the selected codeword is randomly selected in the first data processing device using a physical unclonable function.

9. Method according to claim 1, wherein emitting the selected codeword from the first data processing device comprises transmitting the selected codeword from the first data processing device to a second data processing device of the plurality of second data processing devices.

10. Method according to claim 1, further comprising:
   receiving a noisy selected codeword in one of the plurality of second data processing devices;
   determining, in the one of the plurality of second data processing devices, the selected codeword from the noisy selected codeword using a decoding method; and
   determining, in the one of the plurality of second data processing devices, whether the selected codeword is indicative of the target second data processing device.

11. Method according to claim 1, wherein the selected codeword is determined as indicative of the target second data processing device if the selected codeword is contained in the set of error correction codewords assigned to the identifier indicative of the target second data processing device.

12. Method according to claim 1, wherein the identifier is modified using a randomly generated offset number before determining the outer codeword from the identifier.

13. Computer program product comprising instructions which, when the computer program product is executed by a first data processing device, cause the first data processing device to perform the method according to claim 1.

14. System for identification via channels comprising a plurality of data processing devices and configured to:
   select, in a first data processing device, an identifier indicative of a target second data processing device of a plurality of second data processing devices;
   determine, in the first data processing device, an outer codeword from the identifier using an outer code comprising a first outer code and a second outer code;
   determine, in the first data processing device, an optical orthogonal codeword from the outer codeword using an optical orthogonal code;
      identifying entries of the optical orthogonal codeword having a first symbol;
      for each identified entry of the optical orthogonal codeword, mapping the identified entry to a codeword of an error correction code, thereby forming a set of error correction codewords;

randomly selecting a codeword from the set of error correction codewords; and emit the selected codeword from the first data processing device via a channel.

* * * * *